(12) United States Patent
Wang et al.

(10) Patent No.: US 12,338,527 B2
(45) Date of Patent: Jun. 24, 2025

(54) SHUTTER DISK FOR PHYSICAL VAPOR DEPOSITION (PVD) CHAMBER

(71) Applicant: Applied Materials, Inc., Santa Clara, CA (US)

(72) Inventors: Zhiyong Wang, San Jose, CA (US); Halbert Chong, San Jose, CA (US); Irena H. Wysok, San Jose, CA (US); Jianxin Lei, Fremont, CA (US); Rongjun Wang, Dublin, CA (US); Lei Zhou, San Jose, CA (US); Kirankumar Neelasandra Savandaiah, Bangalore (IN); Sundarapandian Ramalinga Vijayalakshmi Reddy, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 79 days.

(21) Appl. No.: 17/900,318

(22) Filed: Aug. 31, 2022

(65) Prior Publication Data

US 2023/0073011 A1 Mar. 9, 2023

Related U.S. Application Data

(60) Provisional application No. 63/240,674, filed on Sep. 3, 2021.

(51) Int. Cl.
*C23C 14/56* (2006.01)
*C23C 14/06* (2006.01)
(Continued)

(52) U.S. Cl.
CPC ...... *C23C 14/564* (2013.01); *H01J 37/32862* (2013.01); *H01J 37/3497* (2013.01);
(Continued)

(58) Field of Classification Search
CPC ........ C23C 14/00–5893; C23C 14/564; C23C 16/4405; H01J 37/32862; H01L 21/203
See application file for complete search history.

(56) References Cited

U.S. PATENT DOCUMENTS 5,304,405 A * 4/1994 Kobayashi ........ H01L 21/67069
427/535
6,125,859 A * 10/2000 Kao .................. H01J 37/32357
134/1.1
(Continued)

FOREIGN PATENT DOCUMENTS

JP 2000-173988 A 6/2000
JP 2010275574 A * 12/2010
KR 10-0606571 B1 7/2006

OTHER PUBLICATIONS

PCT International Search Report and Written Opinion for PCT/US2022/042309 dated Dec. 22, 2022.

*Primary Examiner* — Michael E Barr
*Assistant Examiner* — Richard Z. Zhang
(74) *Attorney, Agent, or Firm* — Moser Taboada

(57) ABSTRACT

Methods and apparatus reduce defects in substrates processed in a physical vapor (PVD) chamber. In some embodiments, a method for cleaning a process kit disposed in an inner volume of a process chamber includes positioning a non-sputtering shutter disk on a substrate support of the PVD chamber; energizing an oxygen-containing cleaning gas disposed in the inner volume of the PVD chamber to create a plasma reactive with carbon-based materials; and heating the process kit having a carbon-based material adhered thereto while exposed to the plasma to remove at least a portion of the carbon-based material adhered to the process kit.

18 Claims, 3 Drawing Sheets

(51) Int. Cl.
*C23C 14/35* (2006.01)
*C23C 16/44* (2006.01)
*H01J 37/32* (2006.01)
*H01J 37/34* (2006.01)

(52) U.S. Cl.
CPC .......... *C23C 14/0605* (2013.01); *C23C 14/35* (2013.01); *C23C 16/4405* (2013.01); *H01J 37/3447* (2013.01); *H01J 2237/335* (2013.01)

(56) References Cited

U.S. PATENT DOCUMENTS

| | | | | |
|---|---|---|---|---|
| 2001/0042513 | A1* | 11/2001 | Kao | H01L 21/67069 118/723 MR |
| 2002/0108571 | A1* | 8/2002 | Black | H01L 21/67109 204/192.12 |
| 2003/0005943 | A1* | 1/2003 | Singh | H01J 37/321 134/1.1 |
| 2003/0029475 | A1* | 2/2003 | Hua | C23C 16/4405 134/1.1 |
| 2003/0183244 | A1* | 10/2003 | Rossman | B08B 7/0035 134/1.1 |
| 2004/0000321 | A1* | 1/2004 | Cui | H01J 37/32862 134/1.2 |
| 2005/0183669 | A1* | 8/2005 | Parkhe | H01L 21/6831 118/724 |
| 2010/0055298 | A1* | 3/2010 | Sommers | C23C 16/4407 134/41 |
| 2010/0071625 | A1* | 3/2010 | Brown | H01J 37/3408 118/728 |
| 2010/0218785 | A1* | 9/2010 | Green | H01J 37/32642 134/1.1 |
| 2010/0239781 | A1* | 9/2010 | Sano | H01J 37/32477 118/723 R |
| 2011/0079241 | A1* | 4/2011 | Sinha | H01J 37/08 134/1.1 |
| 2014/0141253 | A1* | 5/2014 | Fujii | C23C 16/26 428/411.1 |
| 2014/0302254 | A1* | 10/2014 | Sang | C23C 16/4405 427/535 |
| 2014/0326276 | A1* | 11/2014 | Wu | H01J 37/32862 134/1.1 |
| 2015/0293363 | A1* | 10/2015 | Diehl | G02B 5/285 359/589 |
| 2016/0349621 | A1 | 12/2016 | Huang et al. | |
| 2016/0358809 | A1 | 12/2016 | Brown et al. | |
| 2018/0036775 | A1* | 2/2018 | Shah | B08B 7/0035 |
| 2018/0108519 | A1* | 4/2018 | Babayan | C23C 14/35 |
| 2019/0348283 | A1* | 11/2019 | Citla | H01L 21/02318 |
| 2020/0051797 | A1* | 2/2020 | Bhat | C23C 14/165 |
| 2020/0255938 | A1* | 8/2020 | Chong | C23C 14/0605 |
| 2020/0294797 | A1 | 9/2020 | Nozawa et al. | |
| 2020/0395198 | A1 | 12/2020 | Allen et al. | |
| 2021/0319989 | A1 | 10/2021 | Chong et al. | |
| 2022/0349051 | A1* | 11/2022 | Mishra | C23C 16/4405 |

* cited by examiner

SHUTTER DISK FOR PHYSICAL VAPOR DEPOSITION (PVD) CHAMBER

CROSS-REFERENCE TO RELATED APPLICATIONS

This application claims benefit of U.S. provisional patent application Ser. No. 63/240,674, filed Sep. 3, 2021, which is herein incorporated by reference in its entirety.

FIELD

Embodiments of the present principles generally relate to semiconductor processing of semiconductor substrates.

BACKGROUND

Semiconductor process chambers may incorporate a shutter disk to protect the pedestal during processes that may damage the pedestal. The shutter disk is typically formed of a metal material to increase the service life of the shutter disk. However, the inventors have observed that during some processes such as physical vapor deposition (PVD) processes, the shutter disk may actually sputter material into the processing volume of the chamber, leading to additional contamination of the chamber and subsequent defects in processed wafers.

Accordingly, the inventors have provided improved processes and apparatus that reduce or eliminate shutter disk sputtering and contamination of the PVD chamber.

SUMMARY

Methods and apparatus for reducing contamination of PVD chambers from sputter disks and reduction of wafer defects are provided herein.

In some embodiments, a method for cleaning a process kit disposed in an inner volume of a process chamber includes positioning a non-sputtering, or in some embodiments a silicon, shutter disk on a substrate support of the PVD chamber; energizing an oxygen-containing cleaning gas disposed in the inner volume of the PVD chamber to create a plasma reactive with carbon-based materials; and heating the process kit having a carbon-based material adhered thereto while exposed to the plasma to remove at least a portion of the carbon-based material adhered to the process kit.

In some embodiments, a method for cleaning a process kit disposed in an inner volume of a process chamber includes positioning a non-sputtering, or in some embodiments a silicon, shutter disk on a substrate support of a plasma vapor deposition (PVD) chamber, energizing an oxygen-containing cleaning gas disposed in the inner volume of the PVD chamber to create a plasma in an ultra-high vacuum (UHV) of less than approximately $7.5 \times 10^{-10}$ Torr, wherein the cleaning gas is reactive with carbon-based materials, heating a process kit of the PVD chamber while exposed to the plasma, and removing at least a portion of carbon-based deposition material adhered to the process kit of the PVD chamber.

In some embodiments, the method may further include one or more of wherein the plasma includes oxygen (O) radicals, wherein the shutter disk material is at least 99.99% silicon, wherein the shutter disk material is a silicon and aluminum alloy with a ratio of silicon to aluminum of approximately 1:1, wherein the shutter disk has at least one surface with a roughness of greater than approximately 400 Ra in microinches, at least one of: providing, via a gas supply, the cleaning gas into the inner volume and energizing the cleaning gas using a radio frequency (RF) power source coupled to the PVD to create the plasma, providing, via the gas supply, the cleaning gas into the inner volume and energizing the cleaning gas using a DC power source coupled to the PVD chamber to create the plasma, providing, via the gas supply, the cleaning gas into the inner volume and energizing the cleaning gas using a microwave power source coupled to the PVD chamber to create the plasma, or providing, via a remote plasma source coupled to the PVD chamber, the plasma into the inner volume, providing, using a direct current (DC) power source coupled to the PVD chamber, pulsed DC to a sputtering target disposed in the inner volume of the PVD chamber for physical vapor deposition prior to or after cleaning of the PVD chamber, wherein the process kit may include a shield having a cylindrical body having an upper portion and a lower portion, an adapter section configured to be supported on walls of the PVD chamber and having a resting surface to support the shield, and a heater coupled to the adapter section and configured to be electrically coupled to at least one power source of the PVD chamber to heat the shield, and/or maintaining the sputtering target at a first temperature and heating the shield of the process kit to a second temperature that is greater than the first temperature.

In some embodiments, a non-transitory computer readable storage medium having stored thereon instructions that when executed by a processor perform a method for cleaning a process kit disposed in an inner volume of a physical vapor deposition (PVD) chamber. The method may be as described in any of the embodiments disclosed herein. In some embodiments, the method includes positioning a non-sputtering, or in some embodiments a silicon, shutter disk on a substrate support of the PVD chamber; energizing an oxygen-containing cleaning gas disposed in the inner volume of the PVD chamber to create a plasma reactive with carbon-based materials; and heating the process kit having a carbon-based material adhered thereto while exposed to the plasma to remove at least a portion of the carbon-based material adhered to the process kit. In some embodiments, the method includes positioning a non-sputtering, or in some embodiments a silicon, shutter disk on a substrate support of a plasma vapor deposition (PVD) chamber, energizing an oxygen-containing cleaning gas disposed in an inner volume of the PVD chamber to create a plasma in an ultra-high vacuum (UHV) of less than approximately $7.5 \times 10^{-10}$ Torr, wherein the cleaning gas is reactive with carbon-based materials, heating a process kit of the PVD chamber while exposed to the plasma, and removing at least a portion of carbon-based deposition material adhered to the process kit of the PVD chamber.

In some embodiments the method may further include one or more of wherein the plasma includes oxygen (O) radicals, wherein the shutter disk material is at least 99.99% silicon, wherein the shutter disk material is a silicon and aluminum alloy with a ratio of silicon to aluminum of approximately 1:1, wherein the shutter disk has at least one surface with a roughness of greater than approximately 400 Ra in microinches, and/or wherein the process kit comprises: a shield having a cylindrical body having an upper portion and a lower portion, an adapter section configured to be supported on walls of the PVD chamber and having a resting surface to support the shield, and a heater coupled to the adapter section and configured to be electrically coupled to at least one power source of the PVD chamber to heat the shield.

In some embodiments, a physical vapor deposition (PVD) chamber for processing a substrate may comprise a chamber wall at least partially defining an inner volume within the PVD chamber, a carbon-based sputtering target disposed in an upper section of the inner volume, a pedestal including a substrate support having a support surface to support a substrate below a sputtering target, a power source configured to energize sputtering gas for forming a plasma in the inner volume, a process kit surrounding the sputtering target and the substrate support, and a shutter disk positionable on the substrate support of the PVD chamber, wherein the shutter disk is formed of a shutter disk material that does not react with, or substantially does not react with oxygen-based plasma, for example, an oxygen-based plasma in an ultra-high vacuum (UHV) of less than approximately $7.5 \times 10^{-10}$ Torr.

In some embodiments, the PVD chamber may further include one or more of wherein the shutter disk material is at least 99.99% silicon, wherein the shutter disk material is a silicon and aluminum alloy with a ratio of silicon to aluminum of approximately 1:1, wherein the shutter disk has at least one surface with a roughness of greater than approximately 400 Ra in microinches, and/or wherein the process kit comprises: a shield having a cylindrical body having an upper portion and a lower portion, an adapter section configured to be supported on walls of the PVD chamber and having a resting surface to support the shield, and a heater coupled to the adapter section and configured to be electrically coupled to at least one power source of the PVD chamber to heat the shield.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
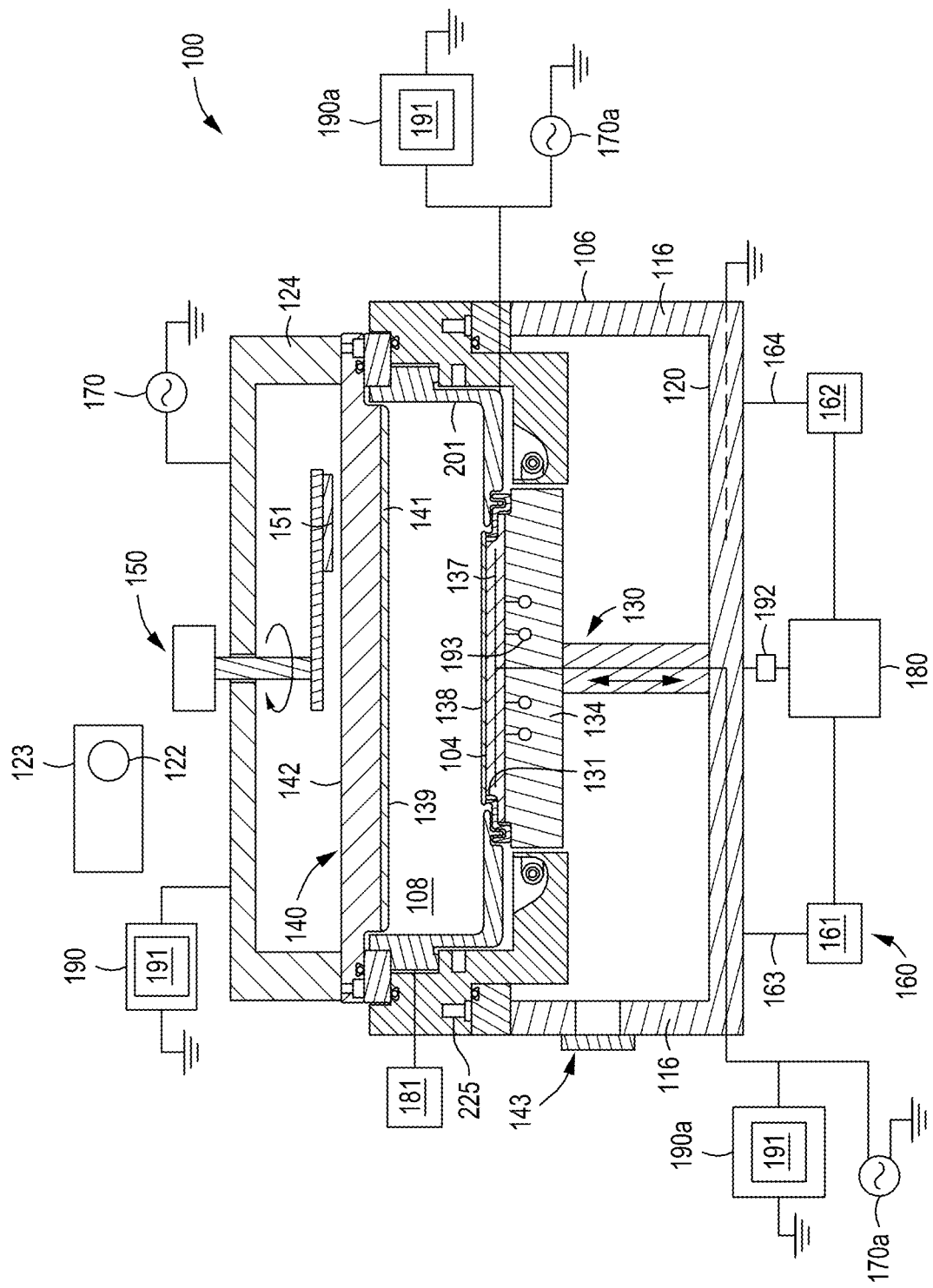
FIG. 1 depicts a schematic side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a shutter disk formed from a non-sputtering material for use in plasma vapor deposition (PVD) process chambers. The non-sputtering shutter disk improves the defectivity performance of the PVD chambers such as, but not limited to, impulse PVD carbon etch chambers. The non-sputtering shutter disk greatly suppresses the contamination and defects caused by both etching and also deposition processes. The methods and apparatus of the present principles may be utilized in environments of in situ etch processes where shutter disks may be exposed to plasmas based on oxygen containing gases such as in carbon-based material deposition processes.

During PVD processing of a substrate, PVD chambers deposit sputtered material that may form a film on all components surrounding the plasma. Over time unwanted deposited material may form on process kit shields that are typically provided in the PVD chamber. While deposition of sputtered material on process kit shields is an accepted practice, such sputtered material can shed particles that can damage a sputtering target used during PVD and/or can contaminate a substrate being processed. Maintenance of the process kit shields typically includes removing the process kit shields, which can include multiple components, from the PVD chamber, chemically etching the process kit shields to an original state and reinstalling the process kit shields so that the process kit shields can be reused. Such processes can be time consuming, laborious, and costly, and undesirably increase chamber downtime.

To alleviate the time consuming and costly removal of the process kit shields, an in-situ cleaning process may be used whereby the process kit shields are cleaned using a plasma etch cleaning process. The etching process helps to remove the sputtering build up on the process kit shields. Since the etching process removes material from surfaces, the surface of the substrate support must be protected during the cleaning process or the upper surface of the substrate support will be damaged by the etching. To prevent damage to the upper surface of the substrate support during etching, a shutter disk is positioned over the upper surface of the substrate support. The inventors observed, however, that the etching process caused material from the sputter disk to be released into the PVD chamber, and the contamination increased defects in subsequently processed substrates, lowering yields.

The traditional shutter disk for PVD carbon deposition chambers is made from metal material such as titanium. During the etch process, titanium gets physically sputtered off, and settles down inside the process cavity. Then during subsequent deposition processes, the titanium tends to aggregate on the substrate surface causing defect issues. With the non-sputtering shutter disk of the present principles, the titanium contamination is reduced or eliminated, and defects caused by the contamination are substantially reduced. In some embodiments, the non-sputtering shutter disk is a silicon shutter disk. As used herein, a silicon shutter disk refers to a shutter disk that is at least about 50% silicon. In some embodiments, the non-sputtering shutter disk is formed from a 'pure' silicon material. As used herein, 'pure' indicates that the shutter disk contains at least 99.99% of the indicated material. In some embodiments, the non-sputtering shutter disk 122 is formed of a silicon and aluminum-based alloy material and the like. In some embodiments, the alloy may be formed from approximately 50% silicon and approximately 50% aluminum. As used herein, 'non-sputtering shutter disk' refers to a shutter disk formed of a material that does not react, or substantially does not react, with a cleaning plasma (e.g., a plasma used during a cleaning process) such as oxygen-based plasmas and does not release shutter disk material into a PVD chamber in response to such a plasma formed near the shutter disk. Accordingly, a non-sputtering shutter disk is made of a material that will not react with, or substantially will not react with, a plasma formed during a cleaning process, such as a carbon cleaning process, for example, an oxygen plasma-based cleaning process, as described herein.

A silicon shutter disk has several advantages compared to metal shutter disks. The metal contamination level of the PVD chamber from the sputter disk is substantially reduced, the number and severity of metal defects, such as, for example, titanium particles, is substantially reduced, the defect performance is dramatically improved, and the cost of the shutter disk is substantially reduced. The inventors have found that silicon material when used in the shutter disk outperforms dielectric materials such as quartz and the like. The silicon shutter disk has a much better performance in 'killer' defects than a quartz shutter disk. A 'killer' defect as used herein is a defect that prevents a substrate from being used and lowers the substrate yield for a given process. In some embodiments, the silicon shutter disk is made from high purity silicon with similar dimensions as for metal shutter disks. During the etch cleaning processes and/or the paste or chamber condition processes, the silicon shutter disk is positioned on top of the substrate support as a protection. The as deposited material such as carbon or carbon nitride is etched away during the etch cleaning processes. The etch cleaning processes is thorough enough such that no accumulation of carbon and/or carbon nitride on the silicon shutter disk remains through the whole process kit life, substantially decreasing process kit maintenance costs and downtime.

FIG. 1 depicts a schematic side view of a process chamber 100 (e.g., a PVD chamber) that may incorporate a non-sputtering shutter disk in accordance with some embodiments of the present disclosure. The process chamber 100 comprises chamber walls 106 that enclose an inner volume 108 (process volume/cavity). The chamber walls 106 include sidewalls 116, a bottom wall 120, and a lid 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of carbon and/or carbon nitride, or the like.

The process chamber 100 comprises a substrate support 130 which comprises a pedestal 134 to support the substrate 104. The substrate support surface 138 of the pedestal 134 receives and supports the substrate 104 during processing. The pedestal 134 may include an electrostatic chuck or a heater (such as an electrical resistance heater, heat exchanger, or other suitable heating device). The substrate 104 can be introduced into the process chamber 100 through a substrate loading inlet 143 in the sidewall 116 of the process chamber 100 and placed onto the substrate support 130. The substrate support 130 can be lifted or lowered by a support lift mechanism, and a lift finger assembly can be used to lift and lower the substrate 104 onto the substrate support 130 during placement of the substrate 104 on the substrate support 130 by a robot arm. The pedestal 134 is biasable and can be maintained at an electrically floating potential or grounded during plasma operation. For example, in some embodiments the pedestal 134 may be biased to a given potential such that during a cleaning process of a process kit, an RF power source 170 can be used to ignite one or more gases (e.g., a cleaning gas) to create a plasma including ions and radicals that can used to react with one or more materials deposited on the process kit, as will be described in greater detail below.

The pedestal 134 has a substrate support surface 138 having a plane substantially parallel to a sputtering surface 139 of a sputtering target 140. The sputtering target 140 comprises a sputtering plate 141 mounted to a backing plate 142, which can be thermally conductive, using one or more suitable mounting devices, e.g., a solder bond. The sputtering plate 141 comprises a material to be sputtered onto the substrate 104. The backing plate 142 is made from a metal, such as, for example, stainless steel, aluminum, copper-chromium or copper-zinc. The backing plate 142 can be made from a material having a thermal conductivity that is sufficiently high to dissipate the heat generated in the sputtering target 140, which is formed in both the sputtering plate 141 and the backing plate 142. The heat is generated from the eddy currents that arise in the sputtering plate 141 and the backing plate 142 and also from the bombardment of energetic ions from the plasma onto the sputtering surface 139 of the sputtering target 140. The backing plate 142 allows dissipation of the heat generated in the sputtering target 140 to the surrounding structures or to a heat exchanger which may be mounted behind the backing plate 142 or disposed within the backing plate 142. For example, the backing plate 142 can comprise channels (not shown) to circulate a heat transfer fluid therein. A suitably high thermal conductivity of the backing plate 142 is at least about 200 W/mK, for example, from about 220 to about 400 W/mK. Such a thermal conductivity level allows the sputtering target 140 to be operated for longer process time periods by dissipating the heat generated in the sputtering target 140 more efficiently, and also allows for relatively rapid cooling of the sputtering plate 141, e.g., when the area on and around a process kit needs to be cleaned.

Alternatively, or additionally, in combination with a backing plate 142 made of a material having a high thermal conductivity and low resistivity and the channels provided thereon, the backing plate 142 may comprise a backside surface having one or more grooves (not shown). For example, a backing plate 142 could have a groove, such as annular groove, or a ridge, for cooling a backside of the sputtering target 140. The grooves and ridges can also have other patterns, for example, rectangular grid pattern, spiral patterns, chicken feet patterns, or simply straight lines running across the backside surface. The grooves can be used to facilitate dissipating heat from the backing plate. In some embodiments, the process chamber 100 may include a magnetic field generator 150 to shape a magnetic field about the sputtering target 140 to improve sputtering of the sputtering target 140. The capacitively generated plasma may be enhanced by the magnetic field generator 150 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 104. The process chamber 100 may, in addition or alternatively, comprise a magnetic field generator 150 that generates a magnetic field near the sputtering target 140 of the process chamber 100 to increase an ion density in a high-density plasma region adjacent to the sputtering target 140 to improve the sputtering of the target material.

A sputtering gas is introduced into the process chamber 100 through a gas delivery system 160, which provides gas from a gas supply 161 via conduits 163 having gas flow control valves (not shown), such as mass flow controllers, to pass a set flow rate of the gas therethrough. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that can react with the sputtered material to form a layer on the substrate 104. The gas is then energized by an RF power source 170 to form or create a plasma to sputter the sputtering target 140. For example, the process gases become ionized by high energy electrons and the ionized gases are attracted to the sputtering material, which is biased at a negative voltage (e.g., −300 to −1500 volts). The energy imparted to an ionized gas (e.g., now positively charged gas atoms) by the electric potential of the cathode causes sputtering. In some embodiments, the reactive gases can directly react with the sputtering target 140 to create compounds and then be subsequently sputtered from the sputtering target 140. For example, the cathode can be energized by both the DC power source 190 and the RF power source. In some embodiments, the DC power source 190 can be configured to provide pulsed DC to power the cathode. Spent process gas and byproducts are exhausted from the process chamber 100 through an exhaust 162. The exhaust 162 comprises an exhaust port (not shown) that receives spent process gas and passes the spent gas to an exhaust conduit 164 having a throttle valve to control the pressure of the gas in the process chamber 100. The exhaust conduit 164 is connected to one or more exhaust pumps (not shown).

In addition, the gas delivery system 160 is configured to introduce one or more of the gases (e.g., depending on the material used for the sputtering target 140), which can be energized to create an active cleaning gas (e.g., ionized plasma or radicals), into the inner volume 108 of the process chamber 100 for performing a cleaning process of a shield of a process kit, which will be described in greater detail below. Alternatively or additionally, the gas delivery system 160 can be coupled to a remote plasma source (RPS) 165 that is configured to provide radicals (or plasma depending on the configuration of the RPS) into the inner volume 108 of the process chamber 100. The sputtering target 140 is connected to one or both of a DC power source 190 and/or the RF power source 170. The DC power source 190 can apply a bias voltage to the sputtering target 140 relative to a shield of the process kit, which may be electrically floating during a sputtering process and/or the cleaning process. The DC power source 190, or a different DC power source 190*a*, can also be used to apply a bias voltage to a cover ring section or a heater of an adapter section of a process kit, e.g., when performing a cleaning process of a shield.

While the DC power source 190 supplies power to the sputtering target 140 and other chamber components connected to the DC power source 190, the RF power source 170 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 170 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source can also be used to supply a bias voltage to the pedestal 134 and/or a cover ring section e.g., when performing a cleaning process of the area on and around a process kit. For example, in some embodiments an additional RF power source 170*a* can be used to energize a biasable electrode 137 that can be embedded in the pedestal 134 (or the substrate support surface 138 of the substrate support 130). The biasable electrode can be used to supply power to a shield and/or the substrate support 130. Moreover, in some embodiments, the RF power source 170 can be configured to energize the biasable electrode 137. For example, one or more additional components e.g., a switching circuit can be provided to switch the electrical path from the cover or lid 124 to the biasable electrode 137.

An RF filter 191 can be connected between the DC power source 190 (or the DC power source 190*a*) and the RF power source 170 (or the RF power source 170*a*). For example, in at least some embodiments, the RF filter can be a component of the circuitry of the DC power source 190 to block RF signals from entering the DC circuitry of the DC power source 190 when the RF power source 170 is running, e.g., when performing a cleaning process. Various components of the process chamber 100 may be controlled by a controller 180 (processor). The controller 180 comprises program code (e.g., stored in a non-transitory computer readable storage medium (memory)) having instructions to operate the components to process the substrate 104. For example, the controller 180 can comprise program code that includes substrate positioning instruction sets to operate the substrate support 130 and substrate transfer mechanism; temperature control of one or more heating components (e.g., a lamp, radiative heating, and/or embedded resistive heaters) of a heater; cleaning process instruction sets to an area on and around a process kit; power control of a microwave power source 181; gas flow control instruction sets to operate gas flow control valves to set a flow of sputtering gas to the process chamber 100; gas pressure control instruction sets to operate the exhaust throttle valve to maintain a pressure (e.g., about 120 sccm) in the process chamber 100; gas energizer control instruction sets to operate the RF power source 170 to set a gas energizing power level; temperature control instruction sets to control a temperature control system in the substrate support 130 or a heat transfer medium supply to control a flowrate of the heat transfer medium to the annular heat transfer channel; and process monitoring instruction sets to monitor the process in the process chamber 100, e.g., monitoring/adjusting an active capacitor tuner (ACT) 192. For example, in at least some embodiments, the ACT 192 can be used to tune the pedestal 134 during a cleaning process, as described in greater detail below.

Figure 2:
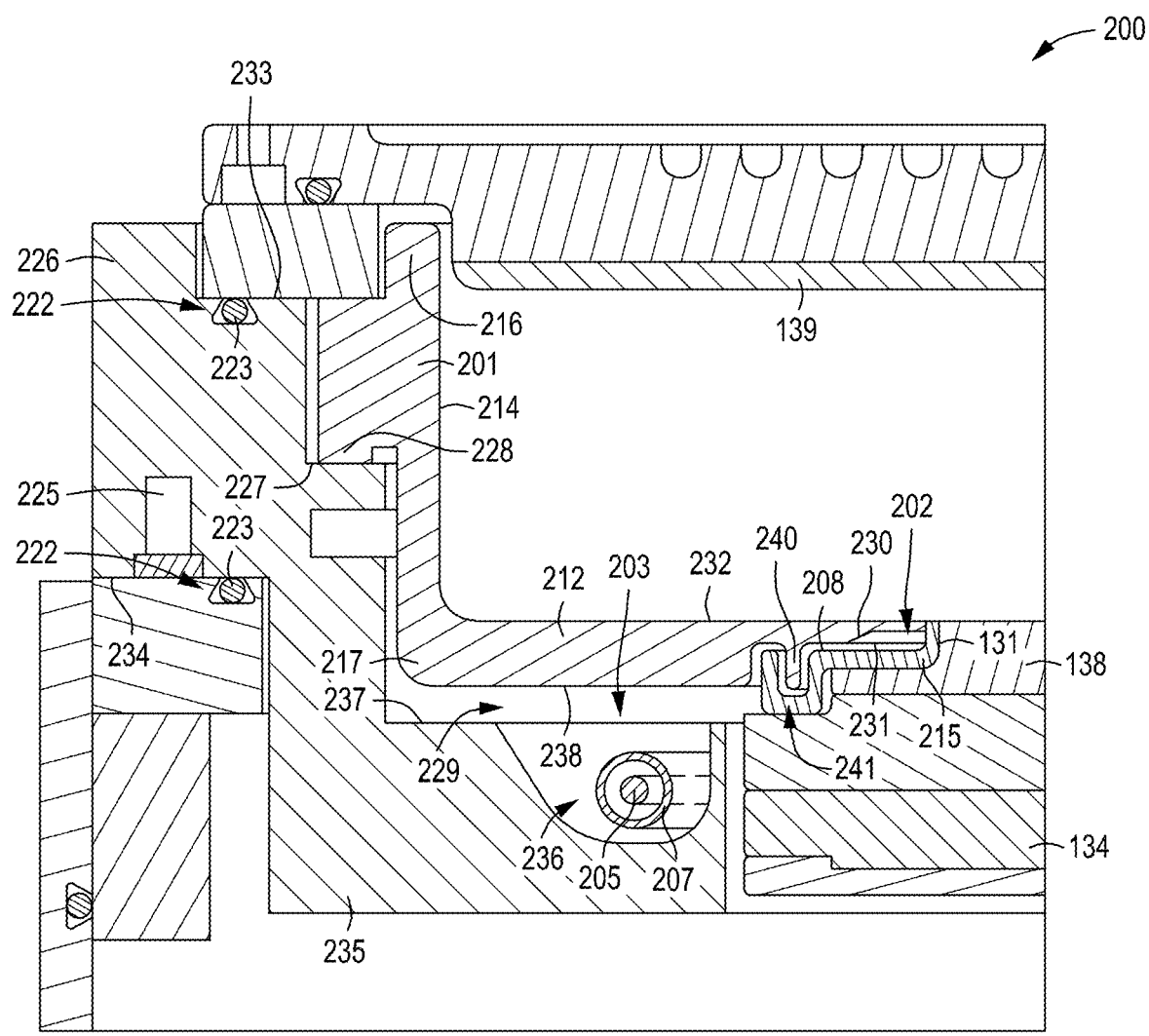
FIG. 2 depicts a schematic cross-sectional view of a process kit in accordance with some embodiments of the present disclosure.

FIG. 2 depicts a schematic cross-sectional view of a process kit 200 in accordance with some embodiments of the present disclosure. The process kit 200 comprises various components including an adapter section 226 and a shield 201 which can be easily removed from the process chamber 100, for example, to replace or repair eroded components, or to adapt the process chamber 100 for other processes. Additionally, unlike conventional process kits, which need to be removed to clean sputtering deposits off the component surfaces (e.g., the shield 201), the process kit 200 is designed for in situ cleaning to remove sputtered deposits of material on the shield 201, as will be described in more detail below.

The shield 201 includes a cylindrical body 214 having a diameter sized to encircle the sputtering surface 139 of the sputtering target 140 and the substrate support 130 (e.g., a diameter larger than the sputtering surface 139 and larger than the support surface of the substrate support 130). The cylindrical body 214 has an upper portion 216 configured to surround the outer edge of the sputtering surface 139 of the sputtering target 140 when installed in the chamber. The shield 201 further includes a lower portion 217 configured to surround the substrate support surface 138 of the substrate support 130 when installed in the chamber. The lower portion 217 includes a cover ring section 212 for placement about a peripheral wall 131 of the substrate support 130. The cover ring section 212 encircles and at least partially covers a deposition ring 208 disposed about the substrate support 130 to receive, and thus, shadow the deposition ring 208 from the bulk of the sputtering deposits. As noted above, in some embodiments the cover ring section 212 can be biased using the DC power source 190a and/or the RF power source 170a, for example, when the area on and around the process kit 200 needs to be cleaned. In some embodiments, the RF power source 170 or the DC power source 190 can also be configured to bias the cover ring section 212. For example, a switching circuit, can be used as described above.

The deposition ring 208 is disposed below the cover ring section 212. A bottom surface of the cover ring section 212 interfaces with the deposition ring 208 to form a tortuous path 202 and the cover ring section 212 extends radially inward from the lower portion 217 of the cylindrical body 214, as shown in FIG. 2. In some embodiments, the cover ring section 212 interfaces with but does not contact the deposition ring 208 such that the tortuous path 202 is a gap disposed between the cover ring section 212 and the deposition ring 208. For example, the bottom surface of the cover ring section 212 may include an annular leg 240 that extends into an annular trench 241 formed in the deposition ring 208. The tortuous path 202 advantageously limits or prevents plasma leakage to an area outside of the process kit 200. Moreover, the constricted flow path of the tortuous path 202 restricts the build-up of low-energy sputter deposits on the mating surfaces of the deposition ring 208 and cover ring section 212, which would otherwise cause them to stick to one another or to the overhanging edge 206 of the substrate 104. Additionally, in some embodiments, the gas delivery system 160 is in fluid communication with the tortuous path 202 for providing one or more suitable gases (e.g., process gas and/or cleaning gas) into the inner volume 108 of the process chamber 100 when the area on and around the process kit 200 needs to be cleaned.

The deposition ring 208 is at least partially covered by a radially inwardly extending lip 230 of the cover ring section 212. The lip 230 includes a lower surface 231 and an upper surface 232. The deposition ring 208 and cover ring section 212 cooperate with one another to reduce formation of sputter deposits on the peripheral walls 131 of the substrate support 130 and an overhanging edge of the substrate 104. The lip 230 of the cover ring section 212 is spaced apart from the overhanging edge 206 by a horizontal distance that may be between about 0.5 inches and about 1 inch to reduce a disruptive electrical field near the substrate 104 (i.e., an inner diameter of the lip 230 is greater than a given diameter of a substrate to be processed by about 1 inch to about 2 inches). The deposition ring 208 comprises an annular band 215 that extends about and surrounds a peripheral wall 131 of the substrate support 130 as shown in FIG. 2. The annular band 215 comprises an inner lip 250 which extends transversely from the annular band 215 and is substantially parallel to the peripheral wall 204 of the substrate support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of the substrate support 130 that are not covered by the substrate 104 during processing. For example, the inner lip 250 surrounds and at least partially covers the peripheral wall 204 of the substrate support 130 that would otherwise be exposed to the processing environment, to reduce or even entirely preclude deposition of sputtering deposits on the peripheral wall 204. The deposition ring 208 can serve to protect the exposed side surfaces of the substrate support 130 to reduce their erosion by the energized plasma species.

The shield 201 encircles the sputtering surface 139 of the sputtering target 140 that faces the substrate support 130 and the outer periphery of the substrate support 130. The shield 201 covers and shadows the sidewalls 116 of the process chamber 100 to reduce deposition of sputtering deposits originating from the sputtering surface 139 of the sputtering target 140 onto the components and surfaces behind the shield 201. For example, the shield 201 can protect the surfaces of the substrate support 130, overhanging edge 206 of the substrate 104, sidewalls 116 and bottom wall 120 of the process chamber 100. The adapter section 226 extends radially outward adjacent from the upper portion 216. The adapter section 226 includes a sealing surface 233 and a resting surface 234 opposite the sealing surface 233. The sealing surface 233 contains an O-ring groove 222 to receive an O-ring 223 to form a vacuum seal, and the resting surface 234 rests upon (or is supported by) the sidewalls 116 of the process chamber 100; an O-ring groove 222 and an O-ring 223 can also be provided in the sidewall 116 opposite the resting surface 234.

The adapter section 226 is configured to be supported on walls of the process chamber 100. More particularly, the adapter section 226 includes an inwardly extending ledge 227 that engages a corresponding outwardly extending ledge 228 adjacent the upper portion 216 for supporting of the shield 201. The adapter section 226 includes a lower portion 235 that extends inwardly toward the pedestal 134 below the cover ring section 212. The lower portion 235 is spaced apart from the cover ring section 212 such that a cavity 229 is formed between the lower portion 235 and the cover ring section 212. The cavity 229 is defined by a top surface 237 of the lower portion 235 and a bottom surface 238 of the cover ring section 212. The distance between the top surface 237 of the lower portion 235 and a bottom surface 238 is such that maximum heat transfer from the heater 203 to the shield 201 can be achieved within a predetermined time during cleaning of the process kit 200. The cavity 229 is in fluid communication with the tortuous path 202 which allows gas, for example, introduced via the gas delivery system 160, to flow into the inner volume 108 of the process chamber 100 when the area on and around the process kit 200 needs to be cleaned.

The lower portion 235 is configured to house the heater 203. More particularly, an annular groove 236 of suitable configuration is defined within the lower portion 235 and is configured to support one or more suitable heating components including, but not limited to, a lamp, radiative heating, or embedded resistive heaters of the heater 203. In the illustrated embodiment, a radiative annular coil 205, which is surrounded by a lamp envelope 207, e.g., glass, quartz, or other suitable material, is shown supported in the annular groove 236. The radiative annular coil 205 can be energized or powered using, for example, the DC power source 190 or the DC power source 190a, which can be controlled by the controller 180, to reach temperatures of about 250° C. to about 300° C. when the area on and around the process kit 200 needs to be cleaned. The adapter section 226 can also serve as a heat exchanger about the sidewall 116 of the process chamber 100. Alternatively or additionally, an annular heat transfer channel 225 can be disposed in either or both the adapter section 226 or the shield 201 (e.g., the upper portion 216) to flow a heat transfer medium, such as water or the like. The heat transfer medium can be used to cool the adapter section 226 and/or the shield 201, for example, upon completion of the process kit 200 being cleaned, or upon completion of one or more other processes having been performed in the process chamber 100.

Figure 3:
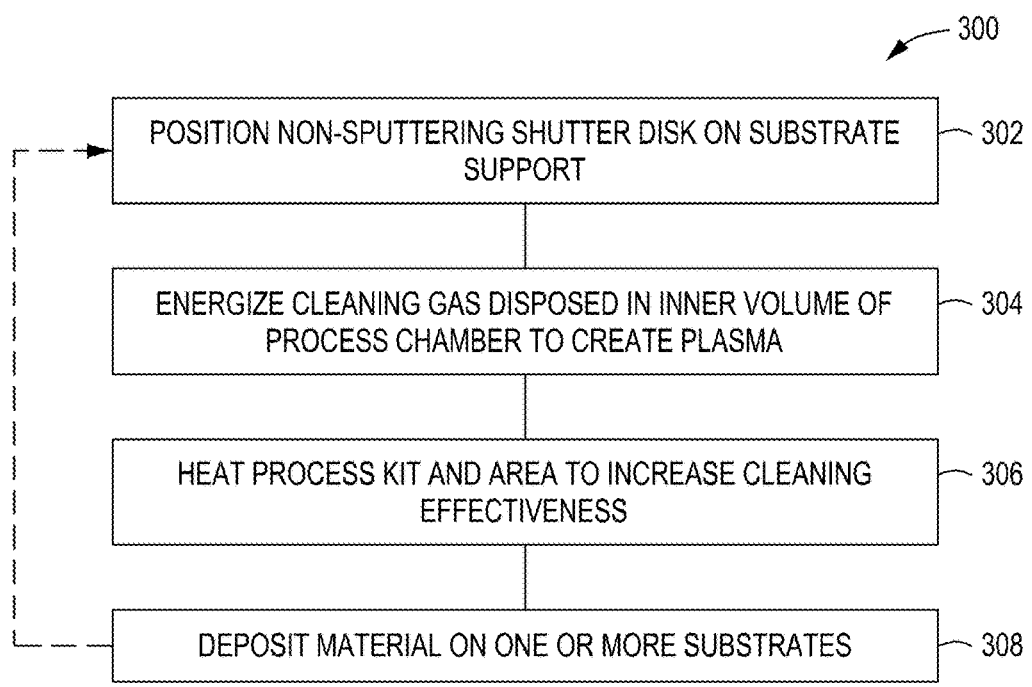
FIG. 3 is a method for cleaning a process kit configured for processing a substrate in accordance with some embodiments of the present disclosure.
Figure 4:
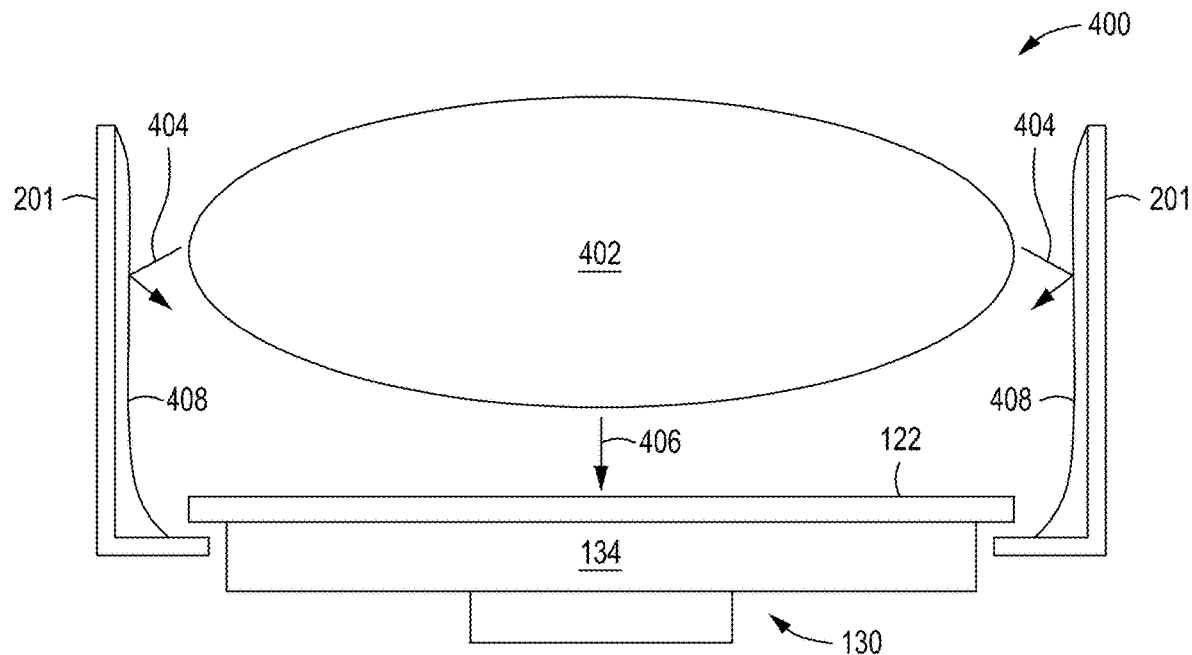
FIG. 4 depicts a schematic side view of a partial process chamber in accordance with some embodiments of the present disclosure.

FIG. 3 is a method 300 for cleaning a process kit configured for processing a substrate in accordance with some embodiments of the present disclosure. The sputtering plate 141 can be made from one or more suitable materials to be deposited on a substrate. For example, the sputtering plate 141, for example, can be made of carbon (C) or carbon nitride (CN), or the like. The specific material that the sputtering plate 141 can be made from can depend on the material desired to be deposited on a substrate in the process chamber. The specific material that the sputtering plate 141 (or target material) is made from can influence one more factors relating to the chamber configuration and cleaning processes, e.g., the type of activated cleaning gases used for cleaning the process kit, etc. In block 302, prior to cleaning on and around the process kit 200, a non-sputtering shutter disk 122 (e.g., a silicon shutter disk) is loaded into the inner volume 108 of the process chamber 100 and disposed on the substrate support 130 to protect the components of the substrate support 130, e.g., the pedestal 134, the substrate support surface 138, etc. as depicted in a view 400 of FIG. 4. The non-sputtering shutter disk 122 can be stored in, for example, a peripheral holding area 123 and can be moved into the processing chamber 100 prior to cleaning on and around the process kit 200. In some embodiments, the non-sputtering shutter disk 122 is formed of pure silicon material (e.g., greater than approximately 99.99% silicon). In some embodiments, the non-sputtering shutter disk 122 is formed of a silicon and aluminum-based alloy material and the like. In some embodiments, the alloy may be formed from approximately 50% silicon and approximately 50% aluminum. In some embodiments, the silicon and aluminum ratio yields a coefficient of thermal expansion (CTE) of approximately 7.8 which is the CTE of carbon-based materials. Similar CTE's minimizes the flaking of the carbon-based deposition materials deposited on the shutter disk during temperature cycling, reducing substrate defects caused by particulates from the shutter disk. In some embodiments, at least one surface of the non-sputtering shutter disk 122 has a surface finish with a roughness of greater than approximately 400 Ra in microinches to ensure adhesion of carbon-based deposition on the shutter disk to prevent flaking of the carbon-based deposition from the shutter disk. The introduction of aluminum into the silicon allows for enhanced surface roughness to prevent the flaking of the carbon-based deposition, increased rigidity to resist deformation of the shutter disk during processing, and reduced brittleness. The surface roughness may be achieved by using, for example and not limited to, blasting media such as approximately 99% $Al_2O_3$ or an equivalent. Cleaning of the alloy may be accomplished using a non-acid/non-caustic process solution that is free of hydrogen fluoride. The surface roughness provides a surface that is more conducive to holding sputtered carbon-based deposition material in order to prevent the material from flaking off of the shutter disk and causing contamination of the PVD chamber and/or defects in the substrates.

One or more activated cleaning gases that are reactive with, for example, carbon-based materials can be used to clean on and around the process kit 200 such as, for example, buildup 408 on the shield 201 in an ultra-high vacuum (UHV) of less than approximately $7.5 \times 10^{-10}$ Torr. The activated cleaning gas, for example, can be a cleaning gas introduced into the process chamber 100 and subsequently energized to form a plasma 402 to create radicals (e.g., the activated cleaning gas) that can be directed toward 404 the process kit 200. The radicals etch away the buildup 408, such as carbon-based deposition material, on the process kit 200 but do not affect 406 (do not react with) the material of the non-sputtering shutter disk 122. Alternatively or in combination, radicals (e.g., the activated cleaning gas) can be introduced into the process chamber from a remote plasma source and then directed toward the process kit 200. The cleaning gases that are activated using the plasma to form radicals of the cleaning gases can be, for example, oxygen ($O_2$), or other oxygen-containing gases e.g., ozone ($O_3$), hydroxide (OH), peroxide ($H_2O_2$), or the like. In accordance with the present disclosure, cleaning on and around the process kit 200 can be performed in accordance with routine maintenance of the process chamber 100. For example, the method 300 can be performed periodically to reduce deposition buildup on and around the process kit 200. For example, when carbon is used as the sputtering plate 141, the method 300 can be used to remove carbon build-up. The cleaning process can be run periodically whenever sufficient materials have built up on the process kit 200. For example, the cleaning process can be performed after about 5 μm of carbon has been deposited, which can be equal to about 50 or so substrates (or wafers) of a deposition for a 1000 A film deposited on each substrate. With the non-sputtering shutter disk 122 positioned on the substrate support, the cleaning process can be run frequently without any concern with the shutter disk adding contaminants to the chamber and/or increasing defects.

To facilitate removal of accumulated deposited material on the process kit 200, the area on and around the process kit 200 may be actively heated (e.g., heated to temperatures above that which are used to process a substrate). For example, when the sputtering target 140 is carbon, to facilitate a carbon and oxygen radical reaction (e.g., to form carbon dioxide), to selectively (e.g., to concentrate cleaning to a specific area within the inner volume 108 of the process chamber 100) clean on and around the process kit 200, and to maximize cleaning on and around the process kit 200, a temperature differential between the sputtering plate 141 and the area on and around the process kit 200 needs to be maintained. Accordingly, to actively achieve such a temperature differential, the sputtering plate 141 can be kept at a relatively low temperature, e.g., a temperature of about 25° C. and to about 100° C. Backside cooling of the sputtering plate 141 using, for example, the heat transfer fluid as described above, can be used to achieve such temperatures. Actively cooling the sputtering plate 141, can be useful when the area on and around the process kit 200 is cleaned shortly after PVD has been performed, e.g., when a temperature of sputtering plate 141 is relatively high. Alternatively or additionally, the sputtering plate 141 can be allowed to passively cool over time without using any cooling devices. Accordingly, in some embodiments, the sputtering plate 141 can be maintained at a temperature of about 25° C. and to about 100° C. during the cleaning process. Alternatively or additionally, during the cleaning process, the sputtering plate 141 can be actively cooled so that no etch reaction happens to the sputtering target 140, thus protecting an integrity of the sputtering target 140 (e.g., sustain the target materials).

Next, in block 306, to ensure that the above-described temperature differential is achieved/maintained, the area on and around the process kit 200 can be actively heated to a temperature of about 250° C. to about 300° C., e.g., heating the shield. As noted above, the radiative annular coil 205 of the heater 203 can be energized using the DC power source 190 (or the or the DC power source 190*a*) to achieve such temperatures, and the amount of energy provided from the DC power source 190 to the radiative annular coil 205 can be controlled by the controller 180. Thereafter, one or more processes can be used to create a plasma to form corresponding ions and radicals, which can used to react with the accumulated deposited material on and around the process kit 200. For example, in block 304 a cleaning gas disposed in the inner volume of the process chamber can be energized to create a plasma to react with and remove buildup such as carbon-based deposition material on the process kit and/or inside of the chamber. For example, in some embodiments, when the accumulated deposited material around the processing kit 200 is carbon, oxygen can be introduced into the inner volume 108 of the process chamber 100 using, for example, the gas delivery system 160. Once introduced, the oxygen plasma including ions and radicals can be created by energizing the oxygen gas using, for example, the RF power source 170 and the pedestal 134 (or the cover ring section 212), each of which as noted above can be biased to a voltage potential using either or both the RF power source 170*a* or the DC power source 190*a*. As the non-sputtering shutter disk 122 is formed of a non-sputtering material in the presence of plasma, the non-sputtering shutter disk 122 does not add further contamination to the process chamber 100 during cleaning. Similarly, nitrogen trifluoride (NF3) gas can be used as the cleaning gas as long as the material of the shutter disk does not react with the plasma.

An active capacitor tuner (e.g., the ACT 192) may be connected to a pedestal 134 can be tuned such that a potential difference between the plasma in the inner volume 108 and the process kit 200 is maintained at a predetermined value (e.g., a predetermined potential difference), such as at a maximum to facilitate removing material deposited on and around the process kit 200. For example, the ACT 192, which is connected to the pedestal 134, is used to maintain a voltage potential difference between the plasma in the inner volume 108 and the shield 201 at a maximum. More particularly, after the RF power source 170 ignites the oxygen gas, the RF power source 170 is used to maintain the plasma within the process chamber 100 (e.g., from about 100 W to about 2500 W) and the controller 180 controls the ACT 192 to ensure that the voltage potential of the plasma is greater than the voltage potential of the shield 210, which is typically grounded through the process chamber 100 during the cleaning process.

Alternatively or additionally, a cleaning gas such as oxygen can be introduced into the inner volume 108 of the process chamber 100 using, for example, the gas delivery system 160, and the microwave power source 181 can be used to create the oxygen plasma to form the oxygen ions and radicals. Alternatively or additionally, the plasma such as oxygen plasma can be created remotely using, for example, the RPS 165. For example, the oxygen plasma can be created by the RPS 165, and the oxygen ions and radicals from the oxygen plasma be directed to the process chamber. Once oxygen gas is energized for forming the oxygen plasma, the oxygen radicals react with the carbon deposited on and around the process kit 200 and convert the deposited carbon to carbon dioxide (e.g., to selectively etch or remove the carbon), which thereafter can then be pumped from the inner volume 108 of the process chamber 100 via, for example, the exhaust 162. Alternatively or additionally, some of the oxygen ions from the oxygen plasma (e.g., in addition to the oxygen radicals) can also be used to react with the carbon deposited on and around the process kit 200 for converting the deposited carbon to carbon dioxide, which can depend on the ratio of oxygen radicals to oxygen ions in the oxygen plasma. For example, a ratio of oxygen ions to oxygen radicals can be controlled so that more (or less) ionized oxygen is created in the plasma and less (or more) oxygen radicals are created.

The controller 180 can control the exhaust 162 to begin exhausting the carbon dioxide at, for example, an endpoint of carbon dioxide production, which can be detected using one or more sensors 193 disposed in the inner volume 108 of the process chamber 100. For example, in some embodiments, the controller 180 can use the one or more sensors 193 to determine an end point of a cleaning time based on a composition of exhaust gas. The controller 180 can also use the one or more sensors 193 to determine a voltage of the pedestal 134 or a plasma within the inner volume 108 of the process chamber 100, e.g., to maintain a maximum potential difference between the plasma in the inner volume and the process kit 200. Alternatively or additionally, the controller 180 can be configured to control the exhaust 162 to begin exhausting the carbon dioxide at, for example, a predetermined time, which can be calculated via empirical data. In at least some embodiments, after the cleaning process is completed, the controller 180 can run one or more additional processes, e.g., seasoning is required to remove some of the debris (flake) deposited on the sputtering target 140 during the cleaning process. For example, seasonings/applications of pulsed DC plasma can be run (e.g., 10-20 runs), with the non-sputtering shutter disk 122 disposed on the substrate support 130, until a condition of the sputtering target 140 has been sufficiently recovered.

In block 308, after completion of the cleaning process, the PVD chamber may resume depositing material on one or more substrates. The PVD chamber cleaning process may be repeated after a set number of substrates have been processed and/or after a given amount of deposition has occurred on the process kit 200. Because the non-sputtering shutter disk 122 does not add contaminants to the PVD chamber during cleaning by sputtering materials into the chamber during the etching process, the PVD chamber may be cleaned often to maintain the chamber's performance without any penalties such as additional defects in substrates and/or additional contaminants in the PVD chamber. The inventors found during testing of materials for the non-sputtering shutter disk that silicon material performed substantially better than titanium material. A silicon shutter disk had a much smaller number of wafer defects greater than 50 nm in a run of 4500 wafers compared to a titanium shutter disk for a run of the same number of substrates. The inventors also found a five-fold decrease in aluminum and titanium contamination levels with silicon material than with titanium material. No titanium particles were found when using the silicon material for the shutter disk. When compared to dielectric materials such as, for example, quartz material, the silicon material exhibited better performance for killer defects (e.g., defects >500 nm). The inventors also tested a silicon oxide material for the shutter disk, but silicon had a much higher particle and defect performance. In some embodiments with an alloy material with an approximately 1:1 ratio of silicon and aluminum exhibited fewer defects over titanium materials and less killer defects than dielectric materials.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for cleaning a process kit disposed in an inner volume of a physical vapor deposition (PVD) chamber having a sputtering target disposed in the inner volume of the PVD chamber, the process kit having a carbon-based material adhered thereto, the method comprising:
    positioning a non-sputtering shutter disk on a substrate support of the PVD chamber;
    energizing an oxygen-containing cleaning gas in a remote plasma source to create a plasma reactive with carbon-based materials and directing the plasma into the inner volume of the PVD chamber;
    maintaining the sputtering target at a first temperature; and
    separate from the plasma, actively heating the process kit to a second temperature that is greater than the first temperature while exposed to the plasma to remove at least a portion of the carbon-based material adhered to the process kit.

2. The method of claim 1, wherein the plasma includes oxygen (O) radicals.

3. The method of claim 1, wherein the shutter disk is at least 99.99% silicon.

4. The method of claim 1, wherein the shutter disk is a silicon and aluminum alloy with a ratio of silicon to aluminum of approximately 1:1.

5. The method of claim 1, wherein the shutter disk has at least one surface with a roughness of greater than approximately 400 Ra in microinches.

6. The method of claim 1, further comprising:
    providing, using a direct current (DC) power source coupled to the PVD chamber, pulsed DC to the sputtering target for physical vapor deposition prior to or after cleaning of the PVD chamber.

7. The method of claim 6, wherein the process kit comprises:
    a shield having a cylindrical body having an upper portion and a lower portion;
    an adapter section configured to be supported on walls of the PVD chamber and having a resting surface to support the shield; and
    a heater coupled to the adapter section and configured to be electrically coupled to at least one power source of the PVD chamber to heat the shield.

8. The method of claim 7, further comprising:
    heating the shield of the process kit to the second temperature using the heater.

9. The method of claim 1, wherein the first temperature is about 25° C. to about 100° C., and wherein the second temperature is about 250° C. to about 300° C.

10. The method of claim 1, wherein the process kit is actively heated prior to creating the plasma.

11. A non-transitory computer readable storage medium having stored thereon instructions that when executed by a processor perform a method for cleaning a process kit disposed in an inner volume of a physical vapor deposition (PVD) chamber having a sputtering target disposed in the inner volume of the PVD chamber, the process kit having a carbon-based material adhered thereto, the method comprising:
    positioning a non-sputtering shutter disk on a substrate support of the PVD chamber;
    energizing an oxygen-containing cleaning gas in a remote plasma source to create a plasma reactive with carbon-based materials and directing the plasma into the inner volume of the PVD chamber;
    maintaining the sputtering target at a first temperature; and
    separate from the plasma, actively heating the process kit to a second temperature that is greater than the first temperature while exposed to the plasma to remove at least a portion of the carbon-based material adhered to the process kit.

12. The non-transitory computer readable storage medium of claim 11, wherein the plasma includes oxygen (O) radicals.

13. The non-transitory computer readable storage medium of claim 11, wherein the shutter disk is at least 99.99% silicon.

14. The non-transitory computer readable storage medium of claim 11, wherein the shutter disk is a silicon and aluminum alloy with a ratio of silicon to aluminum of approximately 1:1.

15. The non-transitory computer readable storage medium of claim 11, wherein the shutter disk has at least one surface with a roughness of greater than approximately 400 Ra in microinches.

16. The non-transitory computer readable storage medium of claim 11, wherein the process kit comprises:
    a shield having a cylindrical body having an upper portion and a lower portion;
    an adapter section configured to be supported on walls of the PVD chamber and having a resting surface to support the shield; and
    a heater coupled to the adapter section and configured to be electrically coupled to at least one power source of the PVD chamber to heat the shield; and wherein the method further comprises:
    heating the shield to the second temperature using the heater.

17. The non-transitory computer readable storage medium of claim 11, wherein the first temperature is about 25° C. to about 100° C., and wherein the second temperature is about 250° C. to about 300° C.

18. The non-transitory computer readable storage medium of claim 11, wherein the process kit is actively heated prior to creating the plasma.

* * * * *